United States Patent [19]

Singer et al.

[11] 4,104,587

[45] Aug. 1, 1978

[54] BANDWIDTH SUBSTITUTION METHOD AND SYSTEM FOR ABSOLUTE MEASUREMENT OF POWER AT ALL RADIO FREQUENCIES

[75] Inventors: Abraham Singer, Silver Spring; Jan M. Minkowski, Baltimore, both of Md.

[73] Assignee: The United States of America as represented by the Secretary of the Army, Washington, D.C.

[21] Appl. No.: 692,270

[22] Filed: Jun. 3, 1976

[51] Int. Cl.² ............................................. G01R 21/00
[52] U.S. Cl. .................................... 324/95; 324/58 A
[58] Field of Search ..................... 324/95, 58 R, 58 A, 324/76 R; 325/67

[56] References Cited

U.S. PATENT DOCUMENTS

| | | | |
|---|---|---|---|
| 2,411,553 | 11/1946 | Ramo | 324/95 |
| 3,034,045 | 5/1962 | Wienschel | 324/58 A |
| 3,349,327 | 10/1967 | Long | 324/95 |

Primary Examiner—Rudolph V. Rolinec
Assistant Examiner—Ernest F. Karlsen

Attorney, Agent, or Firm—Nathan Edelberg; Robert P. Gibson; Saul Elbaum

[57] ABSTRACT

A highly sensitive method and system for making absolute measurements of power at all radio frequencies is described. This method surmounts the primary shortcoming of the other existing methods in that it permits absolute measurement of power at all radio frequencies, whereas all other methods except one, viz, the so-called incremental method, (described in our co-pending application), are inherently frequency limited, with the current upper limit being about 75 GHz. This major advantage stems from the fact that this method utilizes a direct comparison of the unknown rf power with a primary standard, whereas the other methods (with the exception of the incremental method) require a conversion of the power to heat before making the comparison. The main advantage of this method over the incremental method is that it has much higher sensitivity, permitting absolute measurement of rf power to be made down to about −100 dBm, as compared with only about −10 dBm for the incremental method. An additional advantage of this method is that it permits the measurement of noise as well as coherent rf power, whereas the incremental method is valid only for the case of coherent rf.

10 Claims, 1 Drawing Figure

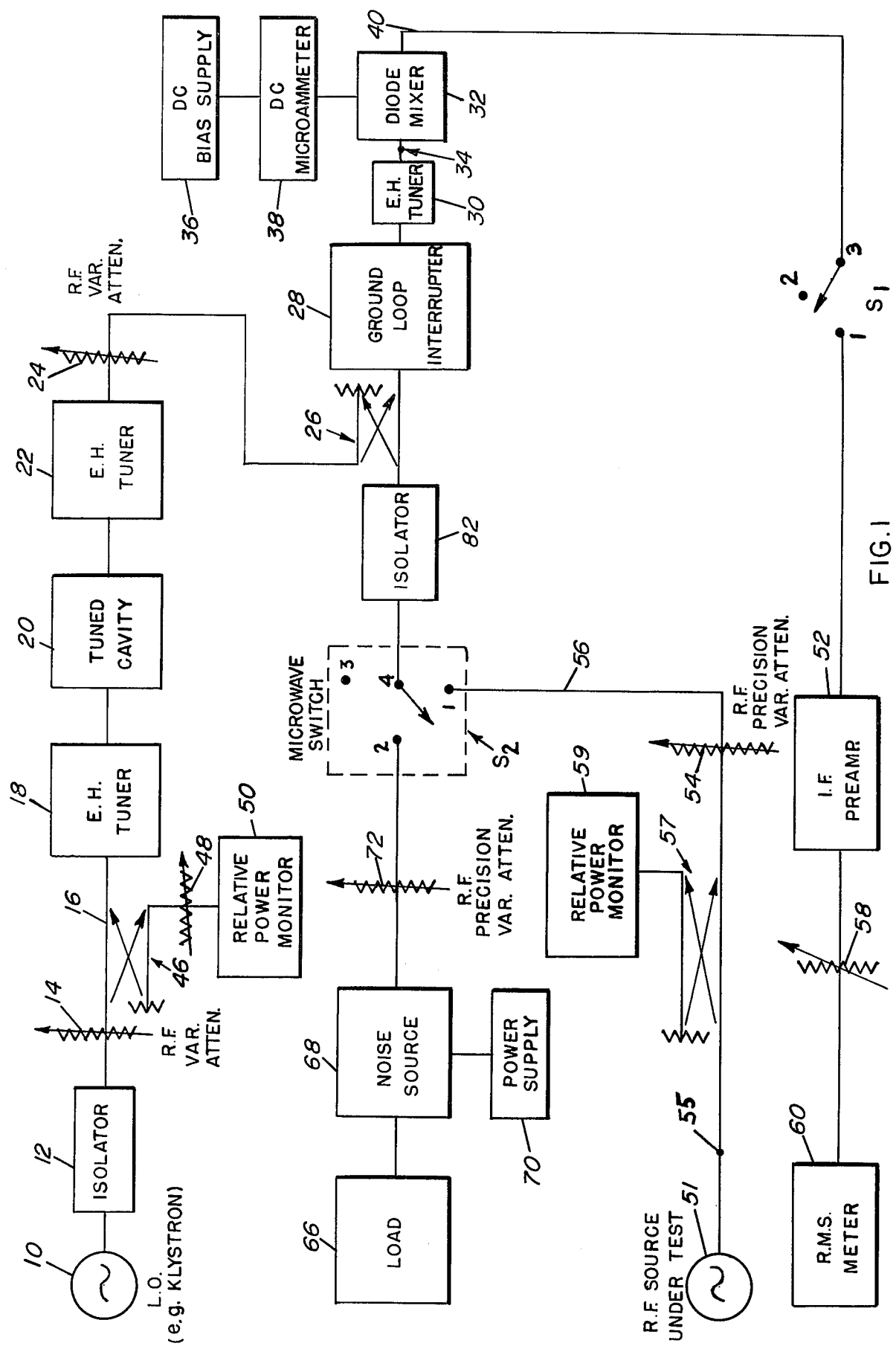

BANDWIDTH SUBSTITUTION METHOD AND SYSTEM FOR ABSOLUTE MEASUREMENT OF POWER AT ALL RADIO FREQUENCIES

RIGHTS OF THE GOVERNMENT

The invention described herein may be manufactured, used, and licensed by or for the U.S. Government for governmental purposes without the payment to me of any royalty thereon.

BRIEF DESCRIPTION OF THE PRIOR ART

As the frequency of an electromagnetic signal increases, it becomes increasingly important to measure the signal's power content. Absolute measurement of power is of fundamental importance in directly establishing the proper functioning of high-frequency systems as well as of most types of high-frequency devices. It is required, for example, for determining the output level of radar transmitters, the sensitivity of radio receivers, and the burnout properties of mixers and video detectors. As a matter of fact, at microwave or higher frequencies, power is one of the two absolute measurements made upon a system. As the frequency increases, however, absolute power measurements become more and more difficult to make. Until recently, these measurements were effectively limited to frequencies below 75 GHz.

Our co-pending application Ser. No. 688,440, filed May 20, 1976, now U.S. Pat. No. 4,045,730, describes a new method, to be referred to henceforth as the incremental method, for making absolute measurements of coherent rf power. The incremental method surmounts the primary shortcoming of the earlier methods in that it permits absolute measurement of power at all radio frequencies, whereas the other methods are inherently frequency limited, with the current upper limit being about 75 GHz. The incremental method permits absolute measurement of coherent rf power down to about −10 dBm with an accuracy of several tenths of a dB.

It is the object of this invention to describe the bandwidth-substitution method for absolute measurement of rf power at all radio frequencies. The major advantage of this method over the incremental method is its enormously improved sensitivity: it permits the measurements to be made down to about −100 dBm, i.e., it yields an improvement in sensitivity of about nine orders of magnitude. Another advantage of this method is that it permits the measurement of noise as well as coherent rf power, whereas the incremental method permits the measurement of coherent rf power only.

BRIEF DESCRIPTION OF THE PRESENT INVENTION

The present bandwidth-substitution method requires a broadband rf noise source of known temperature. Currently, the National Bureau of Standards is providing calibration services for noise sources in the frequency regions between 2.6 and 4, 8 and 18, and 55 and 65 GHz, using as a primary standard a "hot-body noise source," such as a silicon-carbide wedge in a gold waveguide or zinc-titanate wedge in a platinum 13-percent rhodium waveguide hermetically sealed and maintained at about 1300° K. Outside these frequency regions, and particularly above 65 GHz, the noise source may be calibrated against a gas driven shock tube, since it has been demonstrated, primarily with the aid of published papers, that such a tube may be used as a primary standard of high temperature. Broadband rf sources with relatively high excess noise power (e.g., 16 dB or higher) are available up to about 700 GHz. A convenient excess noise level may be readily obtained by stacking such sources in tandem.

A basic feature of the present method is that it uses an accurate bandwidth measurement at a convenient i.f. to achieve an absolute measurement of coherent power at a desired rf. It is for this reason that this method is referred to as the bandwidth-substitution method.

BRIEF DESCRIPTION OF THE FIGURE

The above-mentioned objects and advantages of the present invention will be more clearly understood when considered in conjunction with the accompanying drawing, in which:

The FIGURE is a block diagram of the system utilized in the present invention for absolute measurement of rf power.

DETAILED DESCRIPTION OF THE INVENTION

Referring to the FIGURE, the system will now be described. The actual measurement procedure, utilizing the system, will be explained hereinafter.

A local oscillator 10, such as a klystron, has its output connected to an isolator 12 which ensures unidirectional rf transmission to an rf variable attenuator 14. Transmission continues to an E-H tuner 18 which is inserted in the system for impedance matching. The tuner 18 is followed by a tuned cavity 20 which serves to eliminate AM noise from the signal generated by the oscillator 10. A second E-H tuner 22 is connected to the output of the tuned cavity, the latter-mentioned tuner again serving an impedance matching function. The output from the E-H tuner is connected to an rf variable attenuator 24. Energy transmission continues through the directional coupler 26 to a ground loop interrupter 28 which breaks up a noise ground path, that might otherwise interfere with system measurements. A third E-H tuner 30 is connected to the output of the interrupter to match impedance between the output of the interrupter and the input of a diode mixer 32. The mixer is of conventional design, as are the previously mentioned components of the system. The mixer may typically include a crystal diode. A plane is defined at 34. Physically, the plane may be a theoretical plane that transversely intersects the crystal of diode mixer 32. The diode mixer receives an rf input from the local oscillator 10, via tuner 30. The mixer 32 receives a dc input from the dc bias supply 36. A dc microammeter 38 is interposed between the bias supply and the diode mixer 32 to measure dc current flow.

The output line 40 from the diode mixer 32 is connected to the input of an i.f. pre-amplifier 52, through a coaxial switch $S_1$ connected to the output line 40 of the diode mixer 32. The output from the i.f. pre-amplifier 52 is measured by an rms meter 60, via a variable attenuator 58. The directional coupler 46, connected at the output of the rf variable attenuator 14, is a tap-off point for rf power transmitted along line 16. A variable attenuator 48 is connected between the coupler 46 and a relative power monitor 50. The latter-mentioned monitor may be in the form of a power meter or an oscilloscope. The monitor serves to monitor for changes in power delivered by the local oscillator 10.

During the measurement procedure to be discussed hereinafter, the introduction of noise from a noise source is required. This is accomplished by utilizing an available noise source 68 that is powered by the supply 70. A load 66 is connected to one output of the noise source 68 for proper operation thereof. A second output from the source 68 passes through an rf precision variable attenuator 72. The attenuator is also connected to position 2 of a microwave switch $S_2$. Position 3 of this switch is an open contact. The switch $S_2$ connects the isolator 82 to one of three positions: 1, 2 or 3. When switch $S_2$ connects positions 2 and 4, isolator 82 feeds the directional coupler 26 with rf energy from the noise source.

When measurements are required from a particular rf source 51, under test, the switch $S_2$ is set to connect positions 1 and 4 which completes an rf signal flow from the source 51 to the diode mixer 32 through circuit components including an rf precision variable attenuator 54 and line 56 that connects the attenuator 54 to position 1 of switch $S_2$. Further included in the circuit path are isolator 82, directional coupler 26, ground loop interrupter 28 and E-H tuner 30, all of which have been previously described. In order to verify that the power output from the source 51 remains constant, directional coupler 57 is located at the output of the source 51. A second relative power monitor 59, identical to that of 50, is employed for visual observation of the power level.

MEASUREMENT PROCEDURE

The previous discussion pertained to the actual system of the invention, which is comprised of a novel combination of prior art components. The following discussion will relate to the actual measurement procedure for the absolute measurement of coherent power from the rf source 51.

The local oscillator 10 will be referred to, for purposes of convenience, as LO.

In the FIGURE the rf source 10, of the same type as the one under test (51) serves as a local oscillator in providing part of the bias of the diode mixer 32 (the other part of the bias is provided by dc). The source 10 must have an output of about $-20$ dBm or higher, but its value need not be known.

As in the incremental method, the primary function of the tuned rf cavity 20 in the LO arm is to suppress the AM noise in the vicinity of the output LO line so that its contribution in the i.f. window under consideration is negligible. By going to a sufficiently high i.f., e.g., 400 MHz, (although sometimes several gigahertz may be required), we can eliminate the need for the tuned cavity 20, since at such i.f. the contribution of the local oscillator AM noise is negligible. If we choose not to include a tuned cavity 20 in the LO line, however, then we must provide sufficient i.f. bandwidth to accommodate the frequency drift of two rf sources.

As a first step, a convenient i.f., say 400 MHz, and a convenient i.f. bandwidth, say 20 MHz, are chosen. Then the frequency of the local oscillator 10 ($f_{LO}$) is tuned so that $f_{LO} = f + f_{IF}$, where $f$ is the frequency of the source 51 under test, and $f_{IF}$ is the center frequency of the i.f. pre-amplifier 52. The diode mixer 32 is then biased for linear mixing by adjusting the dc power supply 36 and the LO level (by means of variable precision attenuators 14 and 24). The degree of bias supplied by each is dependent on the maximum available LO power at the crystal, (plane 34). If sufficient LO power is available, the dc bias may be dispensed with.

By use of the noise source 68, the single-sideband system noise factor $F_T$ is measured as follows: with switch $S_2$ set to connect positions 3 and 4 and $S_1$ set to connect positions 1 and 3, the precision i.f. attenuator 58 is adjusted for a convenient indication on the rms meter 60. Now, $S_2$ is set to connect positions 2 and 4, attenuator 72 is set at a convenient level, usually zero dB, and 58 is adjusted to bring the rms-meter 60 back to its previous value. The ratio of the two readings in the attenuator 58, each expressed as a numeric, will be referred to as the Y-factor. Usually, the Y-factor can be conveniently measured to an accuracy of about 0.01 dB, regardless of its value. Thus, at any rf band under consideration, the most sensitive mixer available should be used in order to insure the highest system accuracy. $F_T$ is computed from the expression:

$$F_T = \frac{2N - 1}{Y - 1} \tag{1}$$

where $N$ is the available excess noise power from the noise source 68 at the plane 34 of the mixer diode (i.e., the available excess noise power, expressed as a numeric, at the terminals of the noise source 68 multiplied by the loss in the path between the noise source 68 and the mixer 32, plane 34). The factor of 2 in Equation (1) accounts for the fact that the noise source 68 supplies power in two i.f. windows, above and below the LO frequency.

With $S_2$ connecting positions 3 and 4, and $S_1$ open (i.e., connecting positions 2 and 3), the i.f. output impedance of the mixer diode 32 (while biased by dc and LO) is measured by means of an impedance bridge (not shown in the FIGURE) connected to position 2 of $S_1$. (An accurate measurement requires a bridge having an output signal sufficiently small—e.g., less than 1 mV open-circuit voltage from a 50$\Omega$ generator impedance—so as to have negligible influence on the impedance of the mixer. This is particularly true when the mixer conversion loss is relatively low.)

The i.f. noise bandwidth B is now determined by use of an i.f. generator whose output impedance is approximately equal to the i.f. output impedance of the diode mixer 32 and whose output power level is kept constant with changes in its frequency. The noise bandwidth is not always equal to the 3 dB i.f. bandwidth. Therefore, to establish B accurately, the i.f. pre-amplifier 52 should be swept with a signal generator (not shown) over a much wider frequency range, e.g., until the relative amplitude of the output signal drops by say 20 dB below its center value. Now, assuming that the shape of power output versus frequency curve is roughly that of a single bell, the useful channel bandwidth is computed by dividing the area under the curve by the amplitude at the center. For the sake of simplicity, we are assuming that the superheterodyne system has a single principal response of bandwidth B and no spurious responses.

By use of the rf source 51 under test, the system noise factor $F_T$ is now measured by the signal generator method, as follows: with $S_2$ set to connect positions 3 and 4 and $S_1$ closed (i.e., $S_1$ set to connect positions 1 and 3), attenuator 58 is adjusted to give a convenient indication on the rms meter 60. $S_2$ is then set to connect positions 1 and 4, the level of 58 is increased by 3 dB, and 54 is adjusted to bring the indication of the rms meter 60 back to its previous position. This setting, expressed as a numeric, of attenuator 54 will henceforth be referred to as A. $F_T$ may be expressed as:

$$F_T = \frac{P_o}{kT_oB} - 1 \qquad (2)$$

where $P_o$ is the unknown available rf power at plane 34 from the rf source 51 under test, $k$ is Boltzmann's constant, $T_o$ is the temperature of the system (usually room temperature), and $B$ is the effective noise bandwidth.

The power output P of rf source 51 at its own terminals, namely at plane 55, is simply $$P = P_o/AI \qquad (3)$$

where $I$ is the total insertion loss, expressed as a numeric, between planes 55 and 34 along the path 55 to 1 to 4 to 34.

Solving equations (1), (2) and (3) for P, we get:

$$P = \frac{kT_oB}{AI}\left(\frac{2N-1}{Y-1} + 1\right) \qquad (4)$$

Since all quantities on the right-hand side of the equation are either known or have been measured, P may be readily calculated.

CONCLUSION

The major advantage of the bandwidth-substitution method over the incremental method is its enormously higher sensitivity: it permits absolute measurement of rf power to be made down to about −100 dBm, as compared with only about −10 dBm for the incremental method, i.e., an improvement in sensitivity of about nine orders of magnitude. An additional, but relatively less important advantage of this method is that it permits measurement of noise as well as coherent rf power, whereas the incremental method is valid only for the case of coherent rf.

The two methods require about the same amount of work for executing the measurements, but their steps are not the same. Both methods require the measurement of the i.f. output impedance of the mixer. The incremental method requires a careful measurement of the mixer conversion loss and noise temperature ratio, and of the noise factor of the i.f. pre-amplifier. The bandwidth-substitution method does not require these measurements, but instead, requires a measurement of the effective i.f. noise bandwidth. On the other hand, the incremental method requires only one measurement of the system noise factor, whereas the bandwidth-substitution method requires two so that the quantities in Equations (1) and (2) may be equated. Also, if we choose not to include a tuned rf cavity in the local oscillator arm, in the incremental method, we must provide sufficient i.f. bandwidth to accommodate the drift of one rf source, whereas in the bandwidth substitution method, the i.f. bandwidth must be sufficient to accommodate the drift of two rf sources.

Both methods surmount the primary shortcoming of the other existing methods in that they permit absolute measurement of power at all radio frequencies, whereas the other methods are inherently frequency limited, with the current upper limit being about 75 GHz. This major advantage stems from the fact that both methods utilize a direct comparison of the unknown rf power with a primary standard, whereas all other methods require the comparison to be made through the heat domain. The major usefulness of both methods is, of course, at frequencies above 75 GHz where no other reliable method for absolute measurement of rf power currently exists.

We wish it to be understood that we do not desire to be limited to the exact details of construction shown and described, for obvious modifications can be made by a person skilled in the art.

We claim the following:

1. A method for measuring coherent as well as incoherent (or noise) rf power from an rf source connected to a measuring system, the steps comprising:
   measuring the i.f. noise bandwidth (B) of the system;
   determining the temperature ($T_o$) of the system;
   measuring the system noise factor by using a noise source;
   measuring the system noise factor by using the rf source under test; and
   calculating the rf power from a source under test according to the formula $$P = \frac{kT_ob}{AI}\frac{2N-1}{Y-1} + 1$$

wherein:
   $Y$ is the Y-factor determined in the system noise factor measurement by use of the noise source;
   $N$ is the available excess noise power;
   $k$ is Boltzmann's constant;
   $I$ is the insertion loss; and
   $A$ is the numerical value of an attenuator setting in measuring the system noise factor in terms of the unknown available power from the rf source under test, taking into account losses and attenuation.

2. In a system for performing measurements of rf power from an rf source, a network for determining the system noise factor in terms of the unknown rf power comprising:
   a local oscillator;
   rf mixing means connected in circuit to the output of the oscillator and to the rf source for mixing the output of the oscillator and the rf source;
   i.f. amplifying means for amplifying the i.f. portion of the output signal from the mixing means;
   first switching means connected to the output of the mixing means for selectively connecting the output of the mixing means to the input of the i.f. amplifying means in a first switching position;
   second switching means connected to the input of the mixing means for selectively introducing an additional rf signal thereto;
   a first position of the second switching means connecting the rf source to the mixing means for introducing the additional rf signal to the mixing means,
   measuring means connected in circuit to the output of the amplifying means; and
   attenuating means connected to the rf source for varying the level of rf power going to the second switching means;
   wherein the system noise factor in terms of the unknown rf power is determined.

3. The subject matter set forth in claim 2 together with means for generating the additional rf signal in the form of a noise signal, the second switching means having a second position for introducing the noise signal to the input of the mixing means, the first switching means, in the first switching position, permitting a second determination of the system noise factor by the measuring means.

4. The system as set forth in claim 2 wherein the first switching means is opened for permitting measurement of i.f. bandwidth of the system.

5. A system for performing measurements of rf power from an rf source, the system comprising:
- a local oscillator;
- a predetermined noise source;
- rf mixing means connected in circuit to the output of the oscillator and selectively to either the noise source or the rf source for mixing the output of the oscillator and one of the two sources;
- i.f. amplifying means for amplifying the i.f. portion of the output signal from the mixing means;
- first switching means connected to the output of the mixing means for selectively connecting this output to the input of the i.f. amplifying means in a first switching position;
- second switching means connected to the input of the mixing means for introducing an additional rf signal thereto;
  - a first position of the second switching means connecting the rf source to the input of the mixing means;
  - a second position of the second switching means connecting the predetermined noise source to the input of the mixing means;
- measuring means connected in circuit to the output of the amplifying means for measuring changes in this output and;
- attenuating means connected to the rf source under test for varying the level of rf power going to the second switching means, thus permitting calculation of rf power from the source.

6. The subject matter set forth in claim 5 together with power tap-off means connected between the oscillator and the mixing means to monitor changes in relative power delivered by the oscillator.

7. The subject matter of claim 6 wherein the second switching means is a microwave switch.

8. The subject matter set forth in claim 7 together with a ground loop interrupter connected to the input of the mixing means for eliminating noise introduction, to the mixing means, from a ground path.

9. The subject matter set forth in claim 8 wherein the mixing means includes a crystal diode.

10. The subject matter set forth in claim 8 together with a tuned cavity connected in circuit with the output of the oscillator for filtering out AM noise therefrom.

* * * * *